US010170376B1

(12) United States Patent
Hung

(10) Patent No.: US 10,170,376 B1
(45) Date of Patent: Jan. 1, 2019

(54) DEVICE AND FORMING METHOD THEREOF

(71) Applicant: UNITED MICROELECTRONICS CORP., Hsin-Chu (TW)

(72) Inventor: Ching-Wen Hung, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/790,048

(22) Filed: Oct. 22, 2017

(51) Int. Cl.
| *H01L 31/062* | (2012.01) |
| *H01L 31/113* | (2006.01) |
| *H01L 21/8238* | (2006.01) |
| *H01L 21/768* | (2006.01) |
| *H01L 29/06* | (2006.01) |
| *H01L 29/423* | (2006.01) |
| *H01L 29/786* | (2006.01) |
| *H01L 23/535* | (2006.01) |
| *H01L 21/02* | (2006.01) |
| *H01L 21/225* | (2006.01) |
| *H01L 21/324* | (2006.01) |

(Continued)

(52) U.S. Cl.
CPC .............. *H01L 21/823885* (2013.01); *H01L 21/02532* (2013.01); *H01L 21/02603* (2013.01); *H01L 21/2254* (2013.01); *H01L 21/28518* (2013.01); *H01L 21/324* (2013.01); *H01L 21/76805* (2013.01); *H01L 21/76829* (2013.01); *H01L 21/76895* (2013.01); *H01L 21/823807* (2013.01); *H01L 21/823814* (2013.01); *H01L 21/823871* (2013.01); *H01L 23/535* (2013.01); *H01L 27/092* (2013.01); *H01L 29/0653* (2013.01); *H01L 29/0676* (2013.01); *H01L 29/42392* (2013.01); *H01L 29/78618* (2013.01); *H01L 29/78642* (2013.01); *H01L 29/78651* (2013.01); *H01L 29/78684* (2013.01); *H01L 29/78696* (2013.01)

(58) Field of Classification Search
USPC ... 257/192, E21.403, E21.696, E29.242, 24, 257/329; 438/268, 283, 153, 212, 257, 438/655, 682
See application file for complete search history.

(56) References Cited

U.S. PATENT DOCUMENTS

| 9,466,668 | B2 | 10/2016 | Colinge |
| 9,472,573 | B2 | 10/2016 | Cheng |

(Continued)

*Primary Examiner* — Tram H Nguyen
(74) *Attorney, Agent, or Firm* — Winston Hsu

(57) ABSTRACT

A device includes a first vertical nanowire, a second vertical nanowire and a gate. The first vertical nanowire is disposed on a substrate, wherein the first vertical nanowire includes a silicon germanium channel part. The second vertical nanowire is disposed on the substrate beside the first vertical nanowire, wherein the second vertical nanowire includes a silicon channel part. The gate encircles the silicon germanium channel part and the silicon channel part. The present invention provides a method of forming said device including the following steps. A substrate is provided. A silicon vertical nanowire is formed on the substrate. A germanium containing layer is formed on sidewalls of the silicon vertical nanowire. Germanium atoms of the germanium containing layer are driven into the silicon vertical nanowire, thereby forming a silicon germanium channel part of the silicon vertical nanowire. A gate encircling the silicon germanium channel part is formed.

19 Claims, 7 Drawing Sheets

(51) Int. Cl.
*H01L 21/285* (2006.01)
*H01L 27/092* (2006.01)

(56) References Cited

U.S. PATENT DOCUMENTS

| | | | |
|---|---|---|---|
| 9,954,101 B2 * | 4/2018 | Bu | H01L 29/7827 |
| 2015/0091058 A1 * | 4/2015 | Doyle | H01L 29/7827 |
| | | | 257/192 |
| 2015/0380548 A1 * | 12/2015 | Wang | H01L 29/7827 |
| | | | 257/329 |
| 2016/0181403 A1 | 6/2016 | Xu | |
| 2017/0271510 A1 * | 9/2017 | Wang | H01L 29/7827 |

* cited by examiner

DEVICE AND FORMING METHOD THEREOF

BACKGROUND OF THE INVENTION

1. Field of the Invention

The present invention relates generally to a device and forming method thereof, and more specifically to a device including vertical nanowires and a forming method thereof.

2. Description of the Prior Art

Vertical Transistors are the subject of recent research. In a vertical transistor, a vertical column, which may be a vertical nanowire formed of a semiconductor material, is formed over a substrate, which may be a bulk semiconductor wafer or a semiconductor-on-insulator (SOI) wafer. A gate dielectric and a gate electrode are formed to encircle the nanowire, with the encircled portion of the nanowire forming the channel of the respective vertical transistor. A source and a drain are formed, wherein one underlies the channel, and the other overlies the channel. The vertical transistor has a gate-all-around structure, since the gate may fully encircle the channel. In an all-around gate structure, the drive current of the vertical transistor is high and short-channel effects are minimized.

SUMMARY OF THE INVENTION

The present invention relates generally to a device and a forming method thereof, which diffuses germanium atoms of a germanium containing layer into a vertical nanowire. In this way, a silicon germanium channel of the vertical nanowire can be obtained.

The present invention provides a device including a first vertical nanowire, a second vertical nanowire and a gate. The first vertical nanowire is disposed on a substrate, wherein the first vertical nanowire includes a silicon germanium channel part. The second vertical nanowire is disposed on the substrate next to the first vertical nanowire, wherein the second vertical nanowire includes a silicon channel part. The gate encircles the silicon germanium channel part and the silicon channel part.

The present invention provides a method of forming a device, which includes the following steps. A substrate is provided. A silicon vertical nanowire is formed on the substrate. A germanium containing layer is formed on sidewalls of the silicon vertical nanowire. Germanium atoms of the germanium containing layer are driven into the silicon vertical nanowire, thereby forming a silicon germanium channel part of the silicon vertical nanowire. A gate encircling the silicon germanium channel part is then formed.

According to the above, the present invention provides a method of forming a device, which forms a silicon vertical nanowire on the substrate, forms a germanium containing layer on sidewalls of the silicon vertical nanowire, and drives germanium atoms of the germanium containing layer into the silicon vertical nanowire. In this way, a silicon germanium channel part of the silicon vertical nanowire (first vertical nanowire) can be formed. Moreover, a whole silicon vertical nanowire (second vertical nanowire) may be formed on the substrate beside the silicon vertical nanowire, but the germanium containing layer is only formed on the sidewalls of the silicon vertical nanowire. Thus, processes of forming the silicon vertical nanowire having the silicon germanium channel part and the whole silicon vertical nanowire (second vertical nanowire) without any germanium atoms therein can be integrated and simplified.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
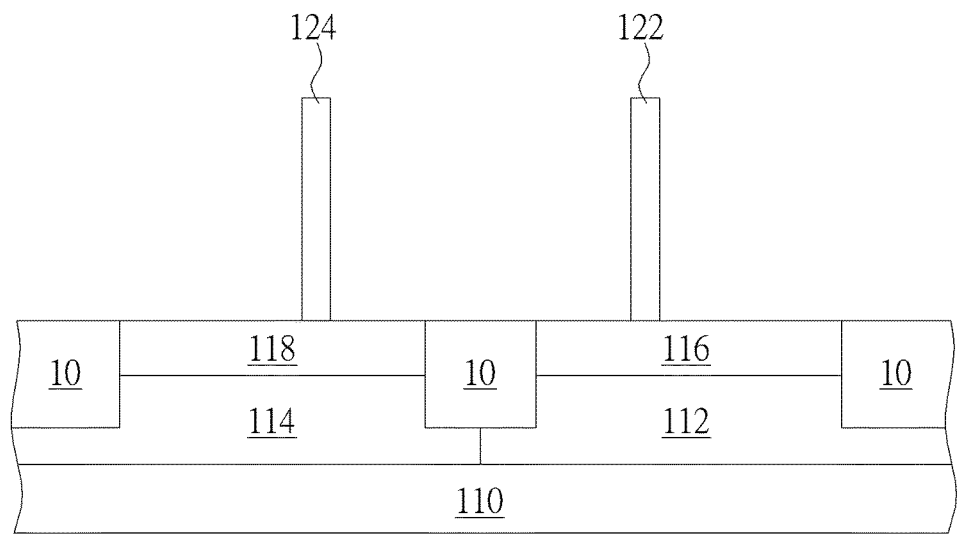
FIG. 1 schematically depicts a cross-sectional view of a method of forming a device according to an embodiment of the present invention.

FIGS. 1-13 schematically depict cross-sectional views of a method of forming a device according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. In this embodiment, the substrate 110 is a silicon substrate, but it is not limited thereto. Isolation structures 10 may be formed in the substrate 110, wherein the isolation structures 10 may be shallow trench isolation (STI) structures, which may be formed by a shallow trench isolation (STI) process, but this is not limited thereto. Implant processes may be processed in the substrate 110. In this embodiment, implant processes may be performed to form an N-well 112, a P-well 114, a heavily doped P-well 116 and a heavily doped N-well 118 in the substrate 110, wherein the heavily doped P-well 116 is in the N-well 112 while the heavily doped N-well 118 is in the P-well 114, and the heavily doped P-well 116 is isolated from the heavily doped N-well 118. This is not limited thereto.

A silicon vertical nanowire 122 and a whole silicon vertical nanowire 124 are directly formed on the heavily doped P-well 116 and the heavily doped N-well 118, respectively. Methods of forming the silicon vertical nanowire 122 and the whole silicon vertical nanowire 124 may include depositing a silicon film and then patterning the silicon film to form the silicon vertical nanowire 122 and the whole silicon vertical nanowire 124, or growing the silicon vertical nanowire 122 and the whole silicon vertical nanowire 124 by epitaxy technology, etc.

Figure 2:
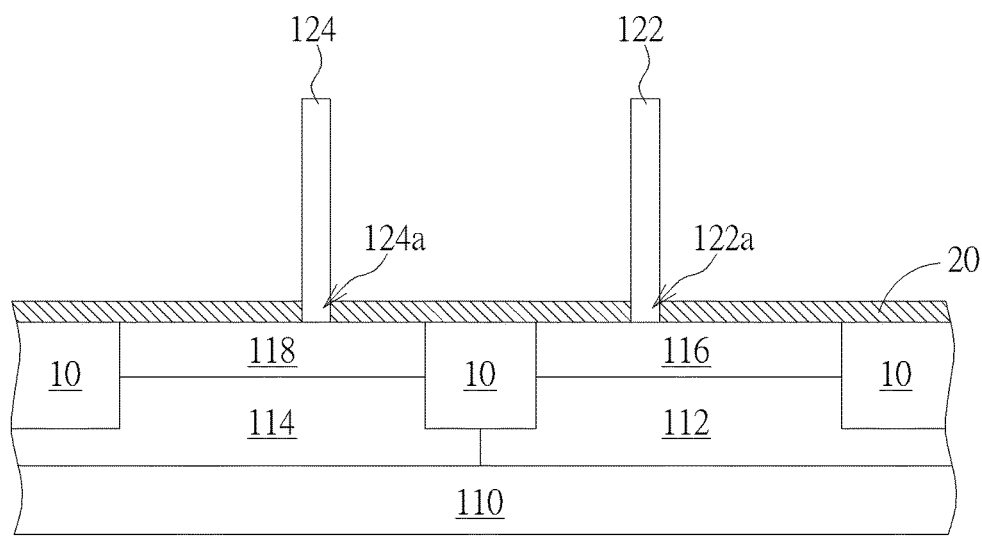
FIG. 2 schematically depicts a cross-sectional view of a method of forming a device according to an embodiment of the present invention.

As shown in FIG. 2, a dielectric layer 20 may be deposited on the substrate 110 next to the silicon vertical nanowire 122 and the whole silicon vertical nanowire 124, wherein the dielectric layer 20 may be a silicon nitride layer, a silicon carbide layer or a carbon doped silicon nitride layer, etc. In this way, a bottom silicon source/drain part 122a and a bottom silicon source/drain part 124a can be formed completely in the dielectric layer 20, and the whole bottom silicon source/drain part 122a and the whole bottom silicon source/drain part 124a can be prevented from being treated in later processes.

Figure 3:
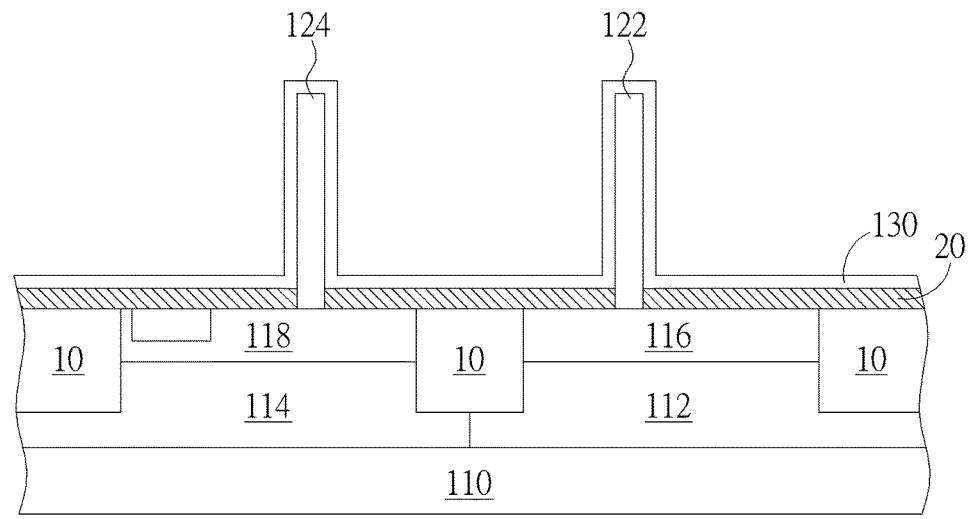
FIG. 3 schematically depicts a cross-sectional view of a method of forming a device according to an embodiment of the present invention.
Figure 4:
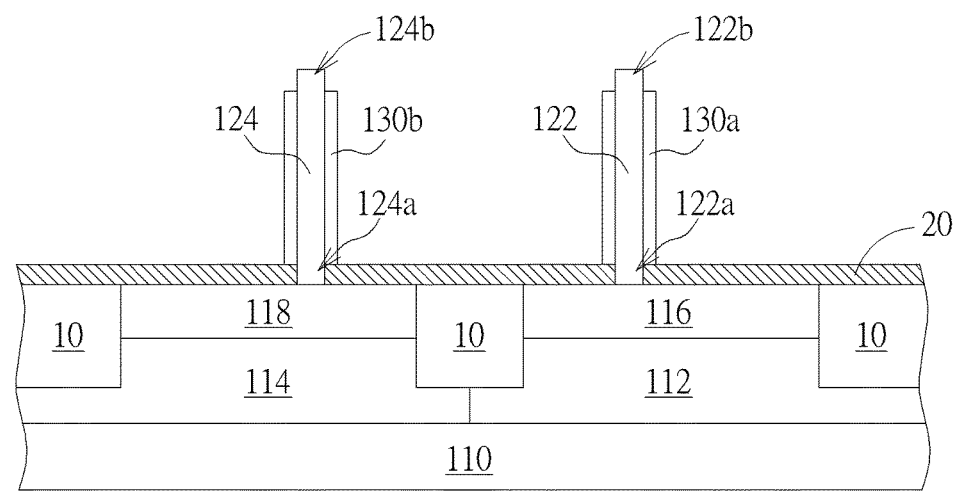
FIG. 4 schematically depicts a cross-sectional view of a method of forming a device according to an embodiment of the present invention.
Figure 5:
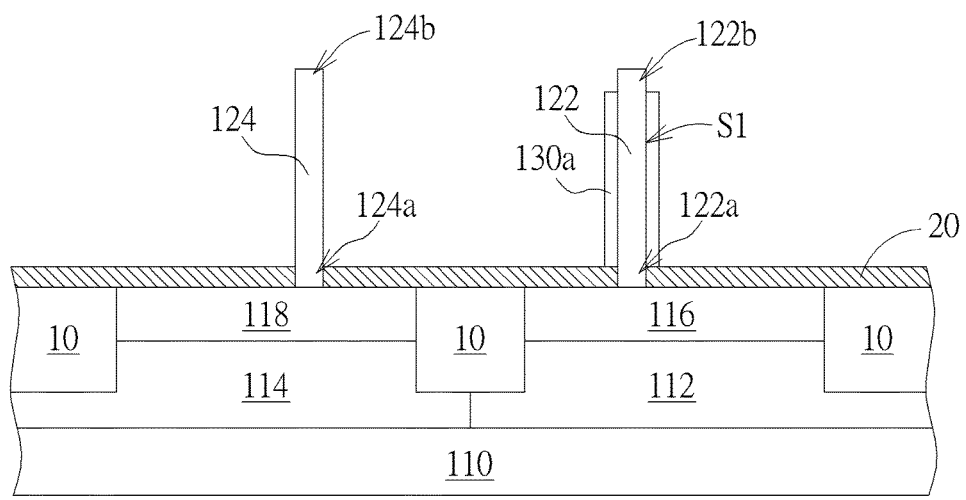
FIG. 5 schematically depicts a cross-sectional view of a method of forming a device according to an embodiment of the present invention.

Please refer to FIGS. 3-5, which illustrate a germanium containing layer 130a formed on sidewalls S1 of the silicon vertical nanowire 122. Methods of forming the germanium containing layer 130a on the sidewalls S1 of the silicon vertical nanowire 122 may include the following. A germanium containing layer 130 may conformally cover the silicon vertical nanowire 122, the whole silicon vertical nanowire 124 and the substrate 110 as shown in FIG. 3. A part of the germanium containing layer 130 covering the substrate 110 and top parts 122b/124b of the silicon vertical nanowire 122 and the whole silicon vertical nanowire 124 are removed to form the germanium containing layer 130a and a germanium containing layer 130b, thereby a top silicon source/drain part 122b/124b will be exposed as shown in FIG. 4. Then, the germanium containing layer 130b is removed as shown in FIG. 5. This means the germanium containing layer 130a is only disposed on the sidewalls S1 of the silicon vertical nanowire 122. The germanium containing layer 130a may include a pure germanium layer, a germanium alloy layer, a germanium containing oxide layer, a germanium containing solid state doping layer, a germanium containing doping monolayer, a germanium containing plasma doping layer, or a germanium containing selective epitaxial layer, etc.

Figure 6:
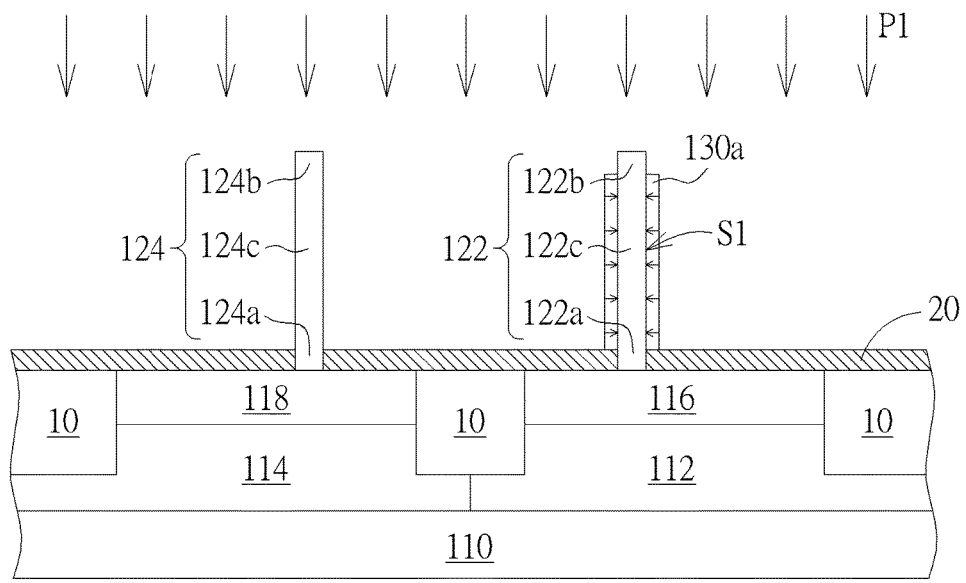
FIG. 6 schematically depicts a cross-sectional view of a method of forming a device according to an embodiment of the present invention.

As shown in FIG. 6, a driving process P1 is performed to drive germanium atoms of the germanium containing layer 130a into the silicon vertical nanowire 122, thereby forming a silicon germanium channel part 122c of the silicon vertical nanowire 122, wherein the bottom silicon source/drain part 122a directly contacts the substrate 110, the top silicon source/drain part 122b is on the bottom silicon source/drain part 122a, and the silicon germanium channel part 122c is between the top silicon source/drain part 122b and the bottom silicon source/drain part 122a. The germanium atoms are driven into the silicon germanium channel part 122c of the silicon vertical nanowire 122 without being driven into the bottom silicon source/drain part 122a of the silicon vertical nanowire 122 and the top silicon source/drain part 122b of the silicon vertical nanowire 122. Since the germanium containing layer 130a is only formed on the sidewalls S1 of the silicon vertical nanowire 122, the silicon germanium channel part 122c is only formed in the silicon vertical nanowire 122 without being formed in the whole silicon vertical nanowire 124. Thereby, the whole silicon vertical nanowire 124 includes the bottom silicon source/drain part 124a, the top silicon source/drain part 124b and a silicon channel part 122c, and the bottom silicon source/drain part 124a directly contacts the substrate 110, the top silicon source/drain part 124b is on the bottom silicon source/drain part 124a, and the silicon channel part 124c is between the top silicon source/drain part 124b and the bottom silicon source/drain part 124a.

Figure 7:
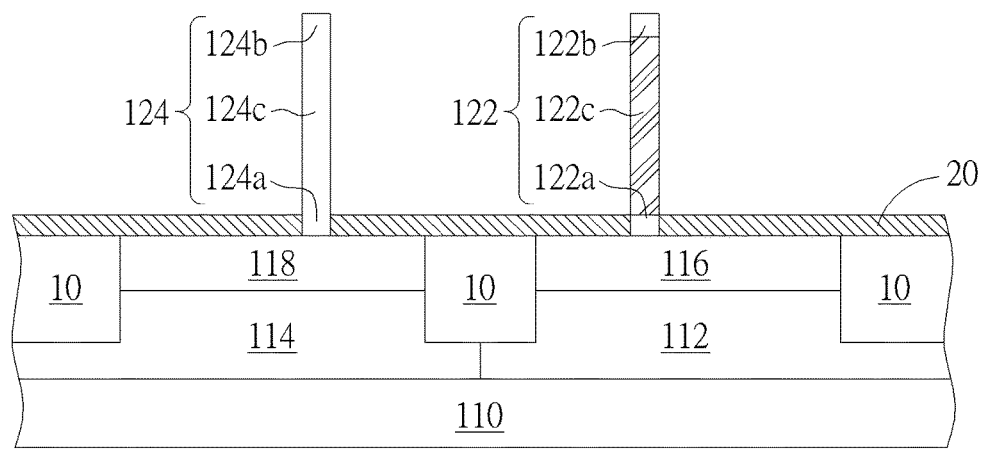
FIG. 7 schematically depicts a cross-sectional view of a method of forming a device according to an embodiment of the present invention.

In this case, the driving process P1 is an annealing process which diffuses germanium atoms of the germanium containing layer 130a into the silicon vertical nanowire 122, wherein the annealing process is preferably a rapid thermal processing (RTP) process, and the processing temperature of the annealing process is preferably at a range of 900° C.-1200° C., but is not limited thereto. In another case, the driving process P1 is an oxidizing process to oxidize the germanium containing layer 130a for diffusing germanium atoms into the silicon vertical nanowire 122, thereby forming the silicon germanium channel part 122c. Thereafter, the germanium containing layer 130a is removed, as shown in FIG. 7.

In this way, the silicon germanium channel part 122c can be formed by only forming the germanium containing layer 130a on the sidewalls S1 of the silicon vertical nanowire 122 and then driving germanium atoms of the germanium containing layer 130a into the silicon vertical nanowire 122. Meanwhile, the top silicon source/drain parts 122b/124b can be reserved. The bottom silicon source/drain parts 122a/124a can also be reserved by forming the dielectric layer 20 next to them in order to prevent the bottom silicon source/drain parts 122a/124a from being diffused by germanium atoms. Hence, processes of forming the silicon vertical nanowire 122 having the silicon germanium channel part 122c and the whole silicon vertical nanowire 124 without any germanium atoms therein can be integrated and simplified.

Figure 8:
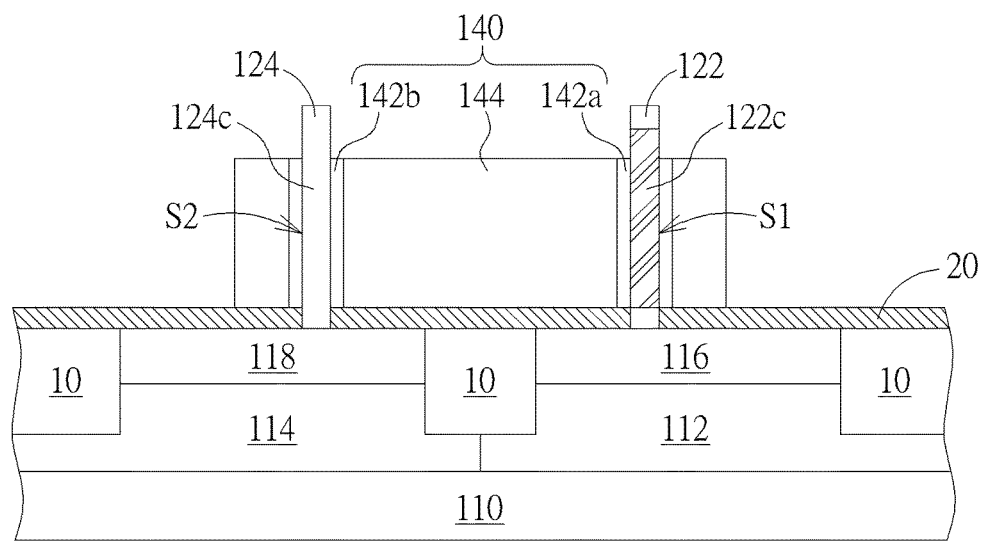
FIG. 8 schematically depicts a cross-sectional view of a method of forming a device according to an embodiment of the present invention.

As shown in FIG. 8, a gate 140 encircling the silicon germanium channel part 122c and the silicon channel part 124c is formed. The gate 140 may include gate dielectric layers 142a on the sidewalls S1 of the silicon germanium channel part 122c and gate dielectric layers 142b on sidewalls S2 of the silicon channel part 124c, and a gate electrode 144 next to the gate dielectric layers 142a/142b. In this embodiment, the gate dielectric layers 142a/142b are dielectric layers having high dielectric constants and the gate electrode 144 is a metal gate electrode, but this is not limited thereto.

Figure 9:
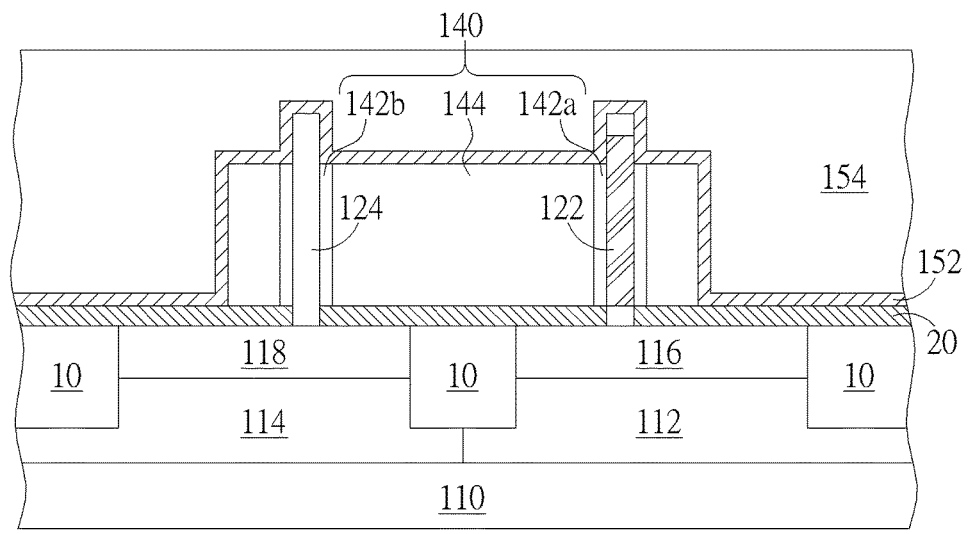
FIG. 9 schematically depicts a cross-sectional view of a method of forming a device according to an embodiment of the present invention.

As shown in FIG. 9, an etch stop layer 152 may conformally cover the silicon vertical nanowire 122, the whole silicon vertical nanowire 124, the gate 140 and the substrate 110, and then a first dielectric layer 154 is formed to cover the etch stop layer 152. Since the etch stop layer 152 conformally covers the silicon vertical nanowire 122, the whole silicon vertical nanowire 124, and the gate 140, the silicon vertical nanowire 122, the whole silicon vertical nanowire 124 and the gate 140 can be prevented from being damaged in later processes. Therefore, a short-circuit caused by exposing the silicon vertical nanowire 122, the whole silicon vertical nanowire 124, and the gate 14 to the above metals can be avoided.

Figure 10:
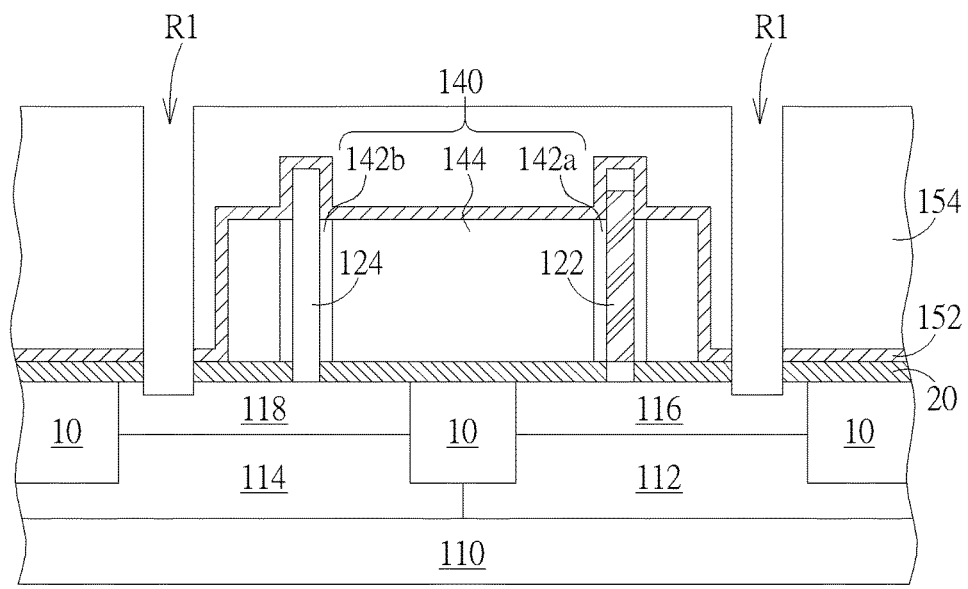
FIG. 10 schematically depicts a cross-sectional view of a method of forming a device according to an embodiment of the present invention.

Thereafter, the etch stop layer 152 and the first dielectric layer 154 are etched to form contact holes R1 and expose a part of the substrate 110, as shown in FIG. 10.

Figure 11:
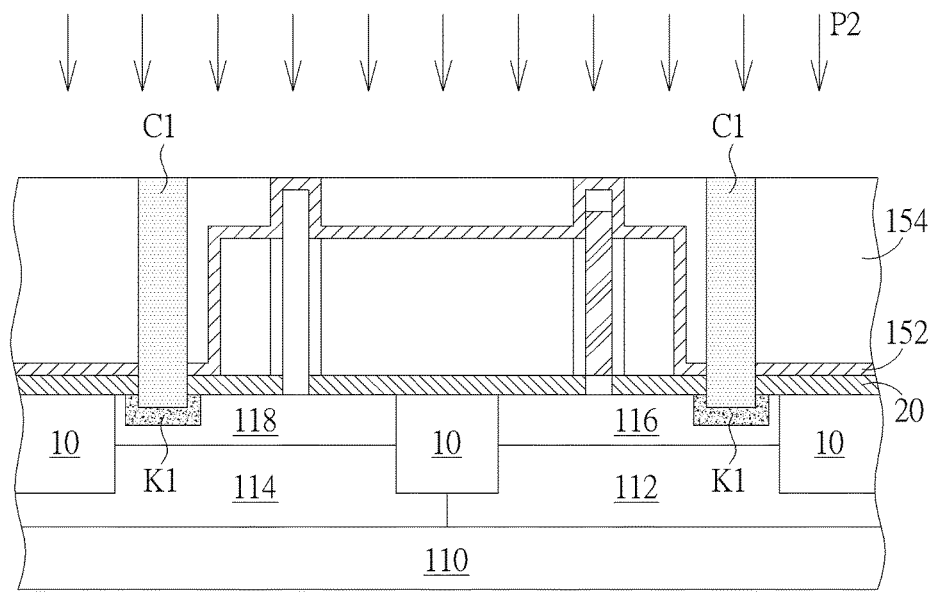
FIG. 11 schematically depicts a cross-sectional view of a method of forming a device according to an embodiment of the present invention.

As shown in FIG. 11, a salicide process P2 may be performed to form a metal silicide K1 in the substrate 110 exposed by the contact holes R1. Then, metals may be filled into the contact holes R1 to form contact plugs C1 in the contact holes R1. In this case, the metal silicide K1 may be a metal silicide of drains.

Figure 12:
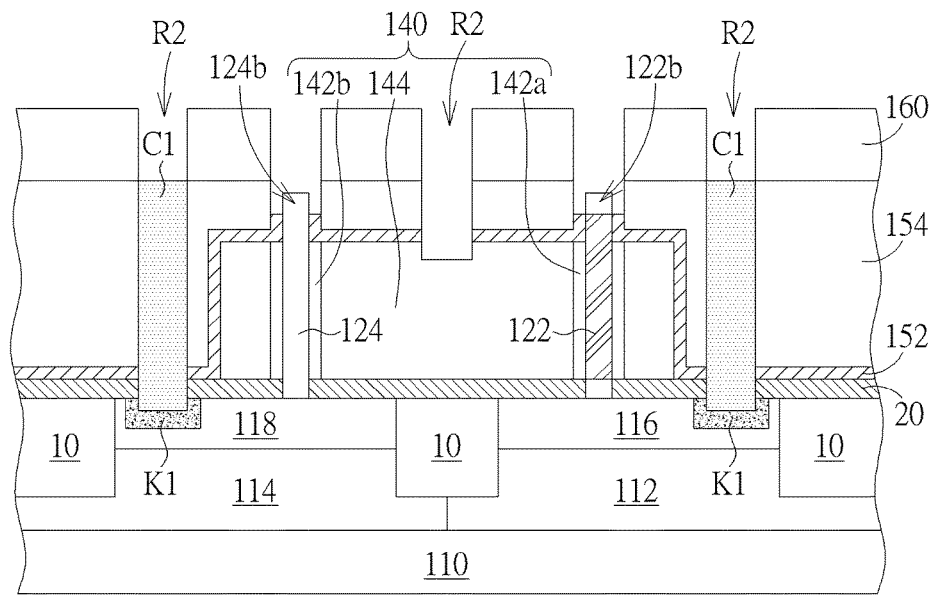
FIG. 12 schematically depicts a cross-sectional view of a method of forming a device according to an embodiment of the present invention.

As shown in FIG. 12, a first dielectric layer 160 may blanketly cover the contact plugs C1, the first dielectric layer 154, the gate 140, the silicon vertical nanowire 122 and the whole silicon vertical nanowire 124. The first dielectric layer 160 is then etched to form contact holes R2 and expose a part of the gate electrode 144, the top silicon source/drain part 122b, the top silicon source/drain part 124b and the contact plugs C1.

Figure 13:
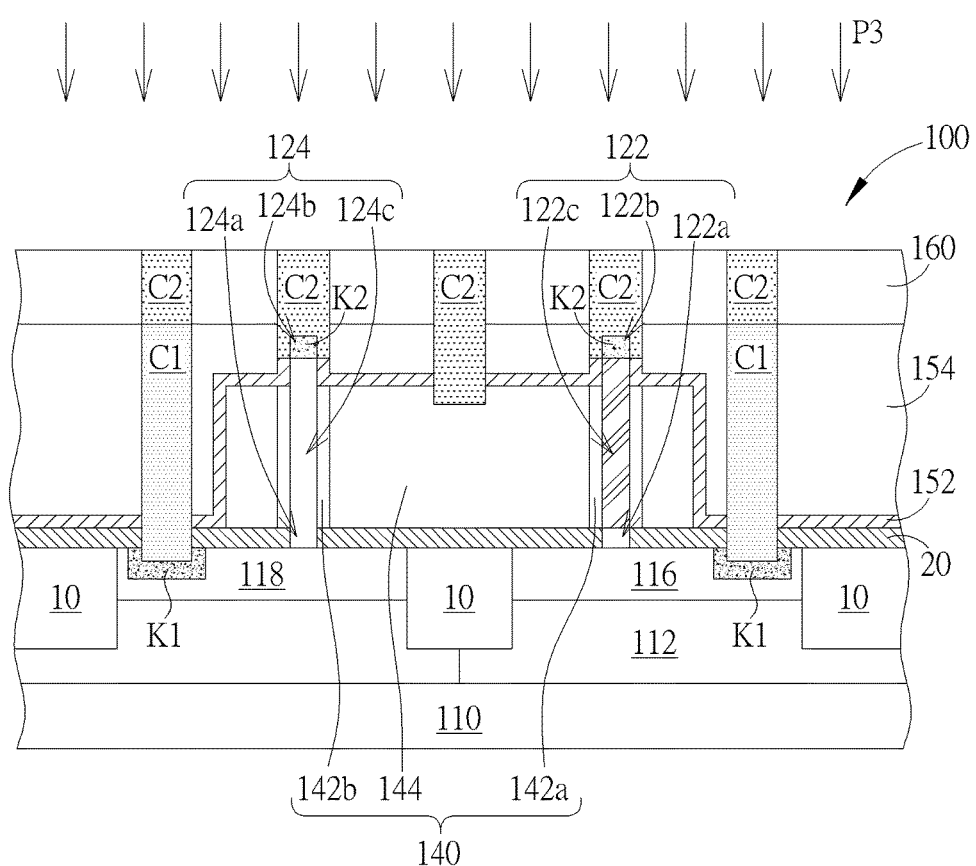
FIG. 13 schematically depicts a cross-sectional view of a method of forming a device according to an embodiment of the present invention.

As shown in FIG. 13, a salicide process P3 may be performed to form a metal silicide K2 in the top silicon source/drain part 122b and the top silicon source/drain part 124b. Then, metals are filled into the contact holes R2 to form contact plugs C2 in the contact holes R2. The metal silicide K2 may be a metal silicide of the sources, and the metal silicide K1 may be a metal silicide of the drains. The metal silicide K1 and the metal silicide K2 of the drains and sources are formed, respectively, wherein the metal silicide K1 and the metal silicide K2 can reduce contact resistance.

Above all, a device 100 is formed. The device 100 may include a first vertical nanowire 122 (the silicon vertical nanowire 122) and a second vertical nanowire 124 (the whole silicon vertical nanowire 124), and the gate 140. The first vertical nanowire 122 includes the bottom silicon source/drain part 122a, the top silicon source/drain part 122b and the silicon germanium channel part 122c, wherein the bottom silicon source/drain part 122a directly contacts the substrate 110, the top silicon source/drain part 122b is on the bottom silicon source/drain part 122a, and the silicon germanium channel part 122c is between the top silicon source/drain part 122b and the bottom silicon source/drain part 122a. The second vertical nanowire 124 is disposed on the substrate 110 next to the first vertical nanowire 122, wherein the second vertical nanowire 124 includes the bottom silicon source/drain part 124a, the top silicon source/drain part 124b and the silicon channel part 122c, and the bottom silicon source/drain part 124a directly contacts the substrate 110. The top silicon source/drain part 124b is on the bottom silicon source/drain part 124a, and the silicon channel part 124c is between the top silicon source/drain part 124b and the bottom silicon source/drain part 124a. The gate 140 encircles the silicon germanium channel part 122c and the silicon channel part 124c. Thus, the first vertical nanowire 122 may be a channel nanowire of an NFET while the second vertical nanowire 124 may be a channel nanowire of a PFET, but this is not limited thereto.

Furthermore, the top silicon source/drain part 122b and the top silicon source/drain part 124b may include the metal silicide K2 for contacting the contact plugs C2. The dielectric layer 20 is disposed on the substrate 110 next to the first vertical nanowire 122 and the second vertical nanowire 124, and the bottom silicon source/drain part 122a and the bottom silicon source/drain part 124a are completely in the dielectric layer 20.

To summarize, the present invention provides a method of forming a device, which forms a silicon vertical nanowire on the substrate, forms a germanium containing layer on sidewalls of the silicon vertical nanowire, and drives germanium atoms of the germanium containing layer into the silicon vertical nanowire. Therefore, a silicon germanium channel part of the silicon vertical nanowire can be formed. Moreover, a whole silicon vertical nanowire may be formed on the substrate next to the silicon vertical nanowire while the silicon vertical nanowire is formed, but the germanium containing layer is only formed on the sidewalls of the silicon vertical nanowire. Thus, processes of forming the silicon vertical nanowire having the silicon germanium channel part and the whole silicon vertical nanowire without any germanium atoms therein can be integrated and simplified.

The germanium containing layer may be a pure germanium layer, a germanium alloy layer, a germanium containing oxide layer, a germanium containing solid state doping layer, a germanium containing doping monolayer, a germanium containing plasma doping layer, a germanium containing selective epitaxial layer. The driving process for driving germanium atoms of the germanium containing layer into the silicon vertical nanowire may be an annealing process, an oxidizing process, etc.

Moreover, a top silicon source/drain part of the silicon vertical nanowire is on the silicon germanium channel part of the silicon vertical nanowire and may include a metal silicide to contact an above contact plug, thereby reducing contact resistance. An etch stop layer may conformally cover the silicon vertical nanowire and the gate to prevent the silicon vertical nanowire and the gate from being damaged in later processes. Therefore, a short-circuit can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device, comprising:
   a first vertical nanowire disposed on a substrate, wherein the first vertical nanowire comprises a silicon germanium channel part, wherein the first vertical nanowire comprises a bottom silicon source/drain part directly contacting the substrate, a top silicon source/drain part on the bottom silicon source/drain part, and the silicon germanium channel part between the top silicon source/drain part and the bottom silicon source/drain part, wherein the material of the silicon germanium channel part is different from the materials of the bottom silicon source/drain part and the top silicon source/drain part;
   a second vertical nanowire disposed on the substrate next to the first vertical nanowire, wherein the second vertical nanowire comprises a silicon channel part; and
   a gate encircling the silicon germanium channel part and the silicon channel part.

2. The device according to claim 1, wherein the top silicon source/drain part comprises a metal silicide.

3. The device according to claim 1, further comprising:
   a dielectric layer disposed on the substrate next to the first vertical nanowire and the second vertical nanowire, wherein the bottom silicon source/drain part is completely in the dielectric layer.

4. The device according to claim 1, wherein the gate comprises a gate dielectric layer on sidewalls of the silicon germanium channel part and the silicon channel part, and a gate electrode next to the gate dielectric layer.

5. The device according to claim 1, further comprising:
   an etch stop layer conformally covering the first vertical nanowire, the second vertical nanowire, the gate and the substrate;

a first dielectric layer covering the etch stop layer; and contact holes in the first dielectric layer and the etch stop layer for exposing the top silicon source/drain part, a top part of the second vertical nanowire, a part of the gate and a part of the substrate.

6. The device according to claim 1, wherein the first vertical nanowire comprises a channel nanowire of an NFET while the second vertical nanowire comprises a channel nanowire of a PFET.

7. A method of forming a device, comprising:
providing a substrate;
forming a silicon vertical nanowire on the substrate;
forming a germanium containing layer on sidewalls of the silicon vertical nanowire;
driving germanium atoms of the germanium containing layer into the silicon vertical nanowire, thereby forming a silicon germanium channel part of the silicon vertical nanowire; and
forming a gate encircling the silicon germanium channel part.

8. The method of forming the device according to claim 7, wherein the germanium containing layer comprises a pure germanium layer, a germanium alloy layer, a germanium containing oxide layer, a germanium containing solid state doping layer, a germanium containing doping monolayer, a germanium containing plasma doping layer, and a germanium containing selective epitaxial layer.

9. The method of forming the device according to claim 7, wherein driving germanium atoms of the germanium containing layer into the silicon vertical nanowire comprises performing an annealing process to diffuse germanium atoms of the germanium containing layer into the silicon vertical nanowire, thereby forming the silicon germanium channel part.

10. The method of forming the device according to claim 9, wherein the annealing process comprises a rapid thermal processing (RTP) process.

11. The method of forming the device according to claim 10, wherein the processing temperature of the annealing process is within a range of 900° C.-1200° C.

12. The method of forming the device according to claim 7, wherein driving germanium atoms of the germanium containing layer into the silicon vertical nanowire comprises oxidizing the germanium containing layer to diffuse germanium atoms into the silicon vertical nanowire, thereby forming the silicon germanium channel part.

13. The method of forming the device according to claim 7, further comprising:
removing the germanium containing layer after the silicon germanium channel part is formed.

14. The method of forming the device according to claim 7, wherein the germanium atoms are driven into the silicon germanium channel part of the silicon vertical nanowire without being driven into a bottom silicon source/drain part of the silicon vertical nanowire and a top silicon source/drain part of the silicon vertical nanowire, wherein the bottom silicon source/drain part directly contacts the substrate, the top silicon source/drain part is on the bottom silicon source/drain part, and the silicon germanium channel part is between the top silicon source/drain part and the bottom silicon source/drain part.

15. The method of forming the device according to claim 14, wherein the steps of forming the germanium containing layer on the sidewalls of the silicon vertical nanowire comprise:
a germanium containing layer conformally covering the silicon vertical nanowire and the substrate; and
removing a part of the germanium containing layer covering the substrate and a top part of the silicon vertical nanowire, so that the top silicon source/drain part are exposed.

16. The method of forming the device according to claim 14, further comprising:
depositing a dielectric layer on the substrate next to the silicon vertical nanowire before the germanium containing layer is formed, thereby enabling the whole bottom silicon source/drain part to be in the dielectric layer.

17. The method of forming the device according to claim 14, further comprising:
performing a salicide process to form a metal silicide in the top silicon source/drain part.

18. The method of forming the device according to claim 7, further comprising:
forming an etch stop layer conformally covering the silicon vertical nanowire, the gate and the substrate;
forming a first dielectric layer covering the etch stop layer; and
etching the first dielectric layer and the etch stop layer to form contact holes and expose a part of the gate, a part of the silicon vertical nanowire and a part of the substrate.

19. The method of forming the device according to claim 7, further comprising:
forming a whole silicon vertical nanowire on the substrate while the silicon vertical nanowire is formed on the substrate, but the germanium containing layer is only formed on the sidewalls of the silicon vertical nanowire.

* * * * *